(12) United States Patent
Yao et al.

(10) Patent No.: US 10,674,647 B1
(45) Date of Patent: Jun. 2, 2020

(54) DEVICE STRUCTURAL ASSEMBLIES

(71) Applicant: Microsoft Technology Licensing, LLC, Redmond, WA (US)

(72) Inventors: Zhicong Yao, Seattle, WA (US); Guang Lei Wang, Wuhu (CN); Tianyu Zhao, Kirkland, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 16/215,009

(22) Filed: Dec. 10, 2018

(51) Int. Cl.
*H05K 9/00* (2006.01)
*H05K 1/18* (2006.01)
*G06F 1/16* (2006.01)

(52) U.S. Cl.
CPC ......... *H05K 9/0032* (2013.01); *G06F 1/1658* (2013.01); *H05K 1/181* (2013.01); *G06F 1/1628* (2013.01); *H05K 2201/10371* (2013.01)

(58) Field of Classification Search
USPC ........................................................ 361/816
See application file for complete search history.

(56) References Cited

U.S. PATENT DOCUMENTS

| | | | |
|---|---|---|---|
| 5,546,275 A | 8/1996 | Moutrie et al. | |
| 6,831,224 B2 * | 12/2004 | Koivusilta | H05K 9/0049 174/375 |
| 6,867,367 B2 * | 3/2005 | Zimmerman | H01L 21/50 174/528 |
| 6,903,262 B2 * | 6/2005 | Blersch | H05K 9/0032 174/385 |
| 8,913,400 B2 * | 12/2014 | Werner | H05K 3/30 361/800 |
| 2014/0071635 A1 | 3/2014 | Werner et al. | |
| 2017/0166150 A1 | 6/2017 | Meyers et al. | |
| 2018/0338395 A1 * | 11/2018 | Chen | H05K 9/0032 |

OTHER PUBLICATIONS

"International Search Report Issued in PCT Application No. PCT/US19/064088", dated Feb. 21, 2020, 14 Pages.

* cited by examiner

*Primary Examiner* — Hung S. Bui
(74) *Attorney, Agent, or Firm* — Rainier Patents, P.S.

(57) ABSTRACT

The description relates to devices, such as computing devices that can include structural assemblies. One example can include a structural component defining a periphery of the structural assembly and an internal region of the structural assembly. The example can also include a sacrificial component positioned in the internal region and secured to the structural component by a breakaway connector that defines a first void and an opposing second void that is at least partially offset from the first void.

19 Claims, 9 Drawing Sheets

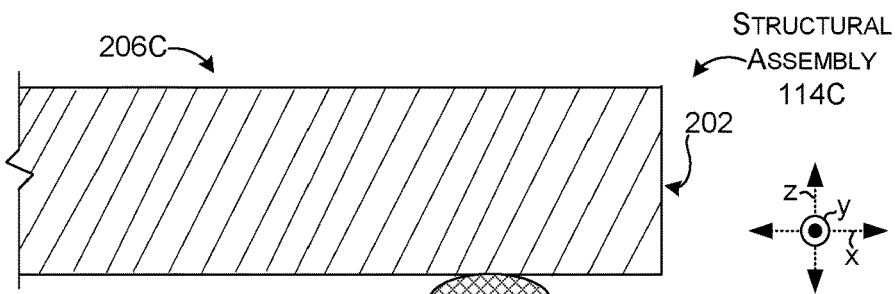
FIG. 7A
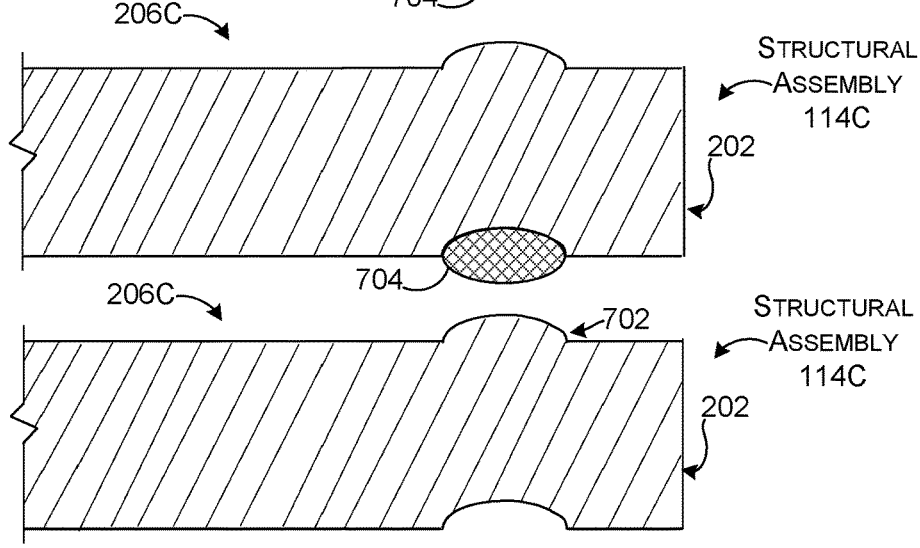
FIG. 7B
FIG. 7C
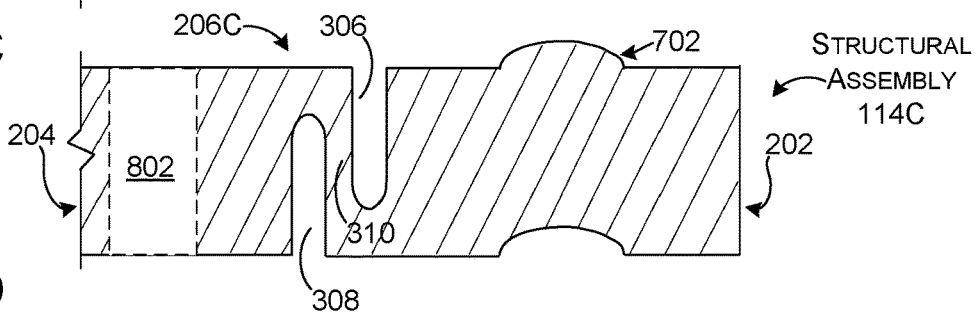
FIG. 7D
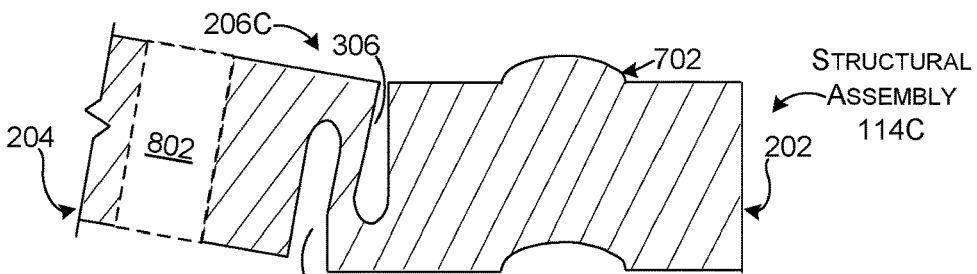
FIG. 7E
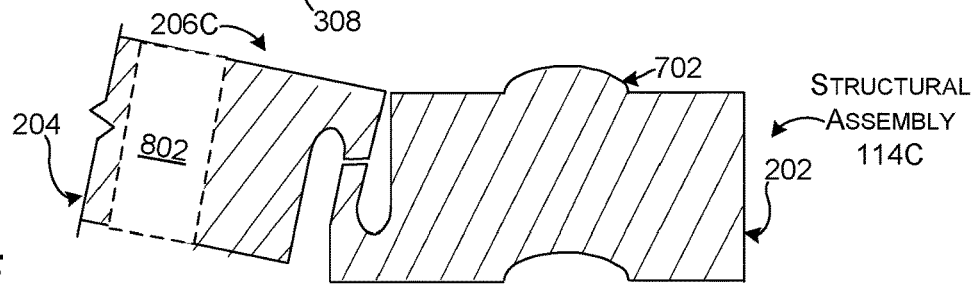
FIG. 7F

DEVICE STRUCTURAL ASSEMBLIES

BRIEF DESCRIPTION OF THE DRAWINGS

The accompanying drawings illustrate implementations of the concepts conveyed in the present document. Features of the illustrated implementations can be more readily understood by reference to the following description taken in conjunction with the accompanying drawings. Like reference numbers in the various drawings are used wherever feasible to indicate like elements. Further, the left-most numeral of each reference number conveys the FIG. and associated discussion where the reference number is first introduced.

FIGS. 4A-4C, 6A-6E, and 7A-7F are sectional views of example structural assembly implementations in accordance with the present concepts.

DESCRIPTION

The present concepts relate to devices, such as computing devices. Often such devices employ structural components in the device, such as to define the periphery of a Faraday cage that shields electronic components of the device. The structural components can be formed from stock substrate, such as sheets or rolls. Once formed, the structural components may be readily deformed or damaged during assembly. For instance, the structural components may deform from a rectangular shape to a parallelogram shape during handling. This deformation could cause the device to fall outside of design tolerances and fail inspection. To avoid this scenario, sacrificial components have been maintained with the structural components during assembly and then removed as one of the final stages. Traditionally, a breakaway tab that includes a pair of opposing V-shaped voids is formed at the border between the sacrificial component and the structural component. However, separation of the sacrificial component from the structural component at the opposing V-shaped voids often inadvertently deforms the structural component and can again cause the device to fail inspection. The present concepts can employ a breakaway tab that employs offset and at least partially overlapping voids. The present breakaway tabs can maintain the sacrificial component and the structural component as a structural assembly during the assembly process, yet can be more readily separated without damaging the structural component. Alternatively or additionally, the present concepts can provide a strengthening structure on the structural component proximate to the breakaway tab. This strengthening structure can also reduce deformation of the structural component during separation of the breakaway tab. These and other aspects are described in more detail below.

Figure 1:
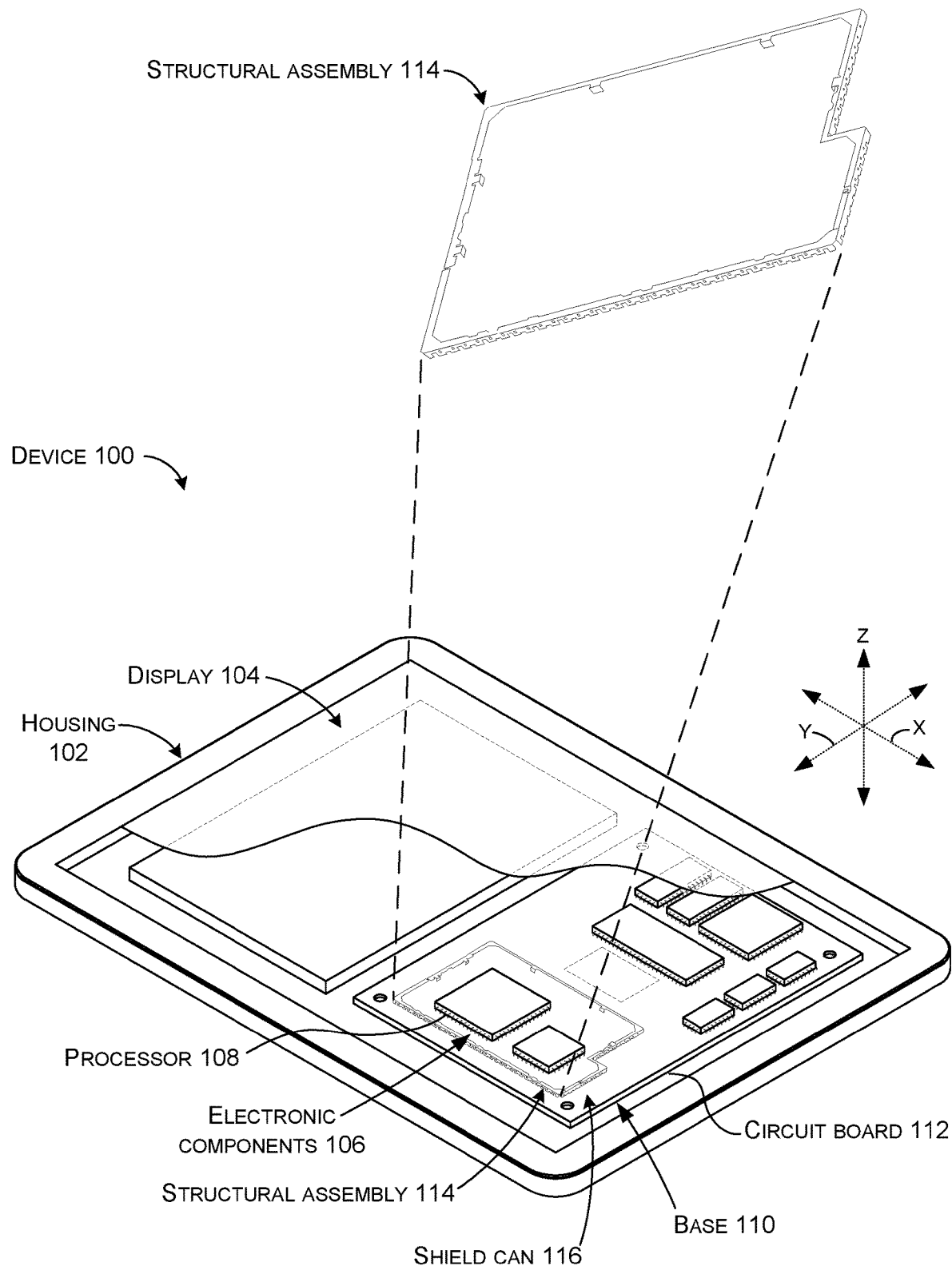
FIGS. 1 and 3B-3D are partial cutaway perspective views of example devices that can include the present structural assembly implementations in accordance with the present concepts.

FIG. 1 shows a partial cutaway view of an example device 100. In this example, device 100 is manifest as a tablet type device, but the present concepts are equally applicable to other types of devices. In this case, the device 100 includes a housing 102 and a display 104 positioned on the housing.

The device 100 can also include electronic components 106, such as a processor 108. These electronic components 106 can be positioned on a base 110, such as a circuit board 112. Device 100 can also include a structural assembly 114. In this case, the structural assembly 114 can form a portion of a shield can or Faraday cage 116 around the processor 108. (Note that not all of the shield can is shown so that underlying components are visible).

Figure 2A:
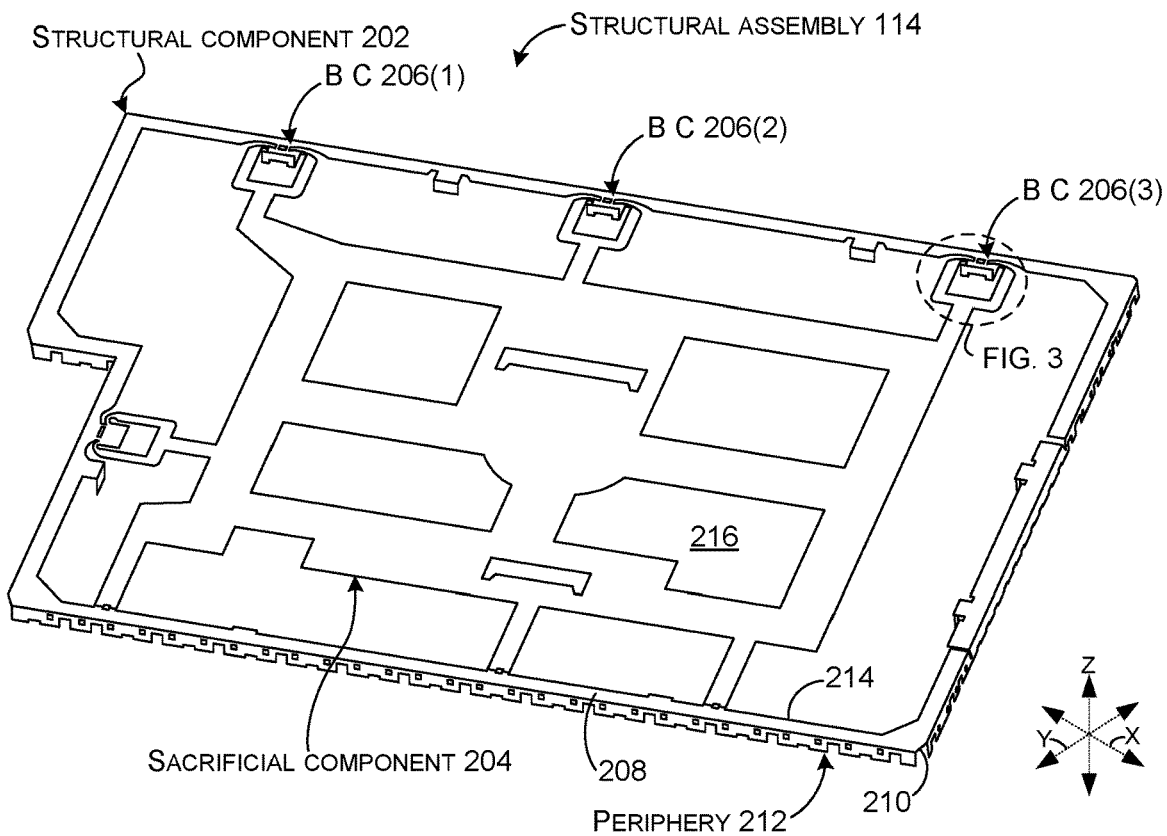
FIGS. 2A, 2B, 3A, and 8 are perspective views of example structural assembly implementations in accordance with the present concepts.
Figure 2B:
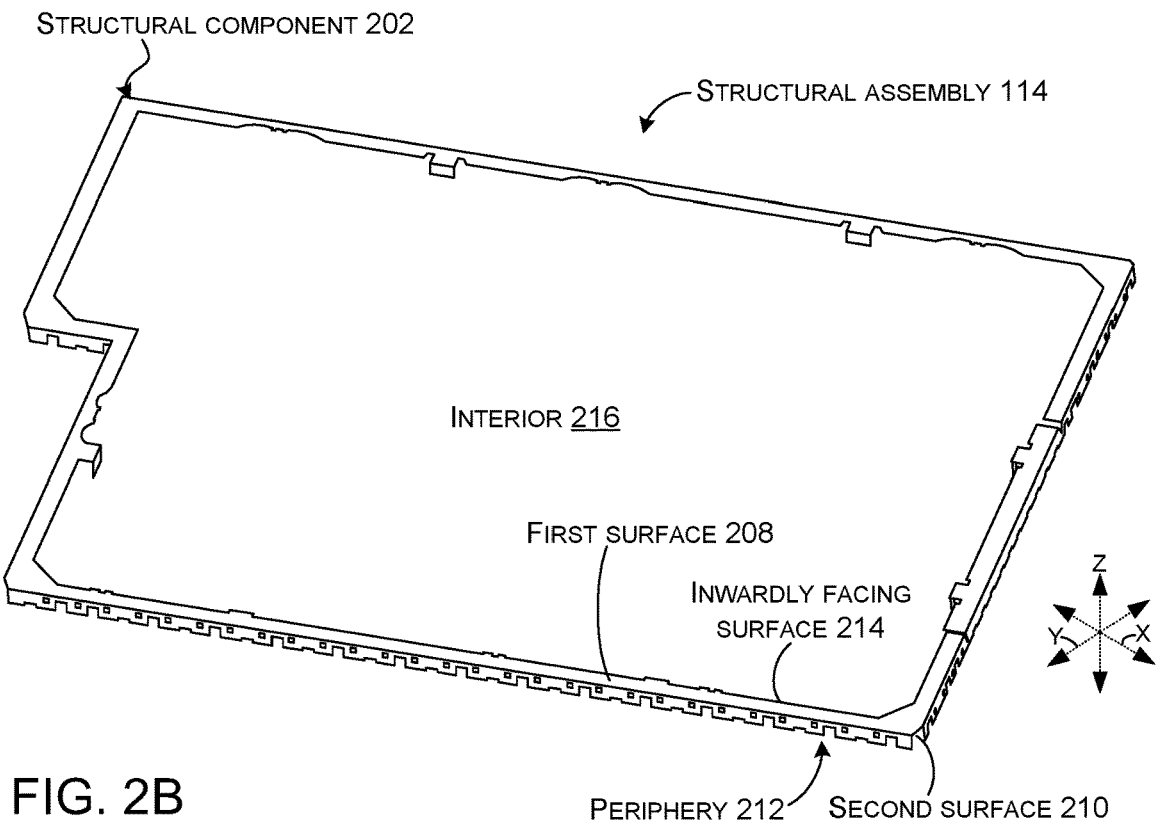

FIGS. 2A and 2B collectively show additional details about example structural assembly 114. The structural assembly 114 can include a structural element or component 202 and a sacrificial element or component 204. FIG. 2A shows both the structural component 202 and the sacrificial component 204. FIG. 2B shows the structural component 202 after removal of the sacrificial component 204. The structural component 202 and the sacrificial component 204 can be joined at one or more breakaway connectors 206. Sacrificial component 204 can help maintain integrity of the structural component 202 during handling and/or assembly. For instance, the sacrificial component 204 can help maintain the overall dimensions of the structural component 202, help maintain the planar configuration of the structural component 202, and/or help avoid bending of the structural component 202.

The structural component 202 can include opposing first and second surfaces 208 and 210. (In these views the first surface 208 is facing toward the reader and second surface 210 is facing away from the reader.) The structural component 202 can define a periphery of the structural assembly 114 as indicated generally at 212 and an inwardly facing surface 214. In this implementation, the sacrificial component 204 can be located in an interior of the structural component 202 as indicated at 216.

While a specific example of a structural assembly 114 is shown in FIGS. 1-2B, the concepts described below can be applied to any type of structural assembly utilized in a device. For instance, the concepts can be applied to any type of structural assembly that is partially prepared and then assembled onto the device (or a greater component assembly of the device) before final processing of the structural assembly.

Figure 3A:
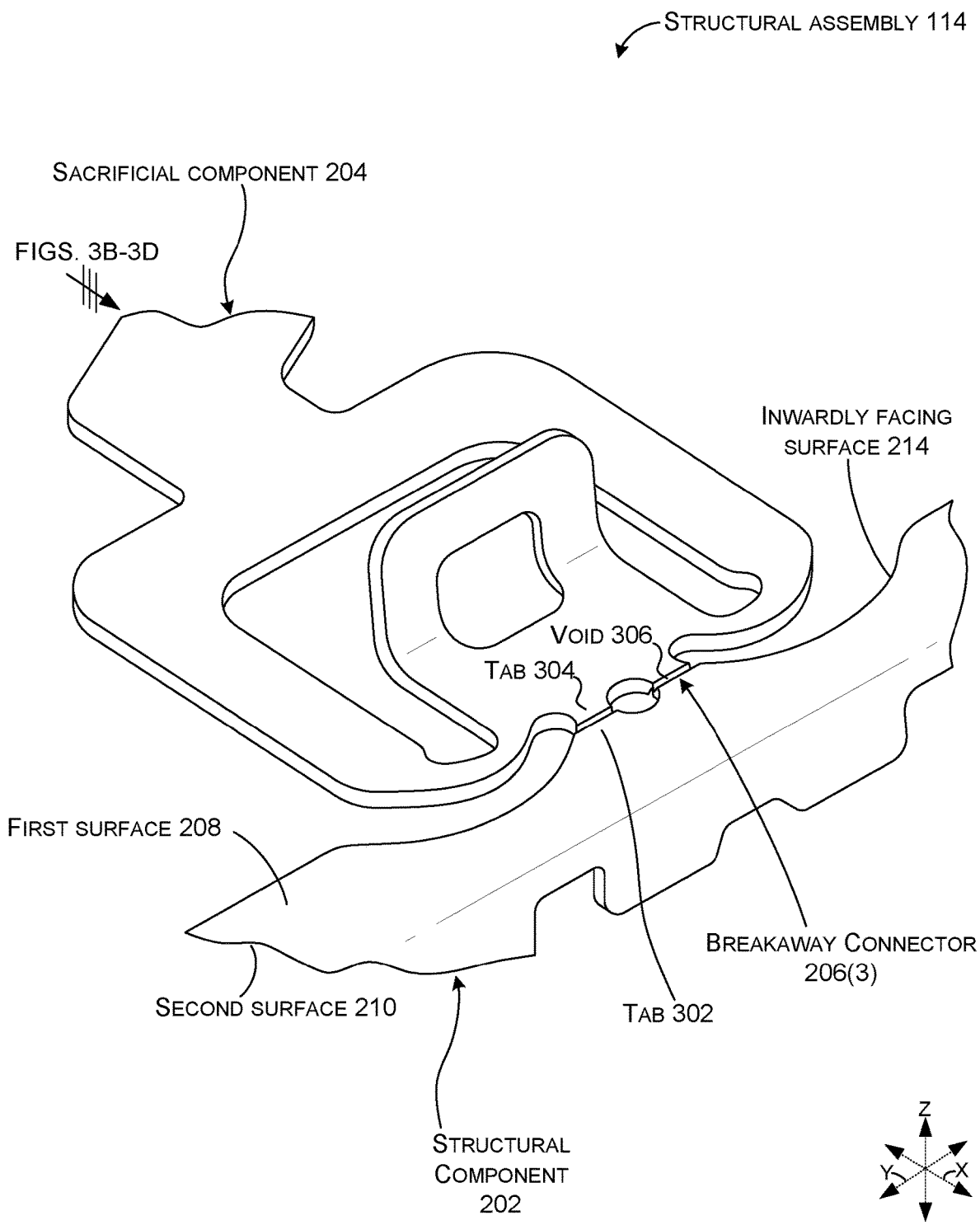
Figure 3B:
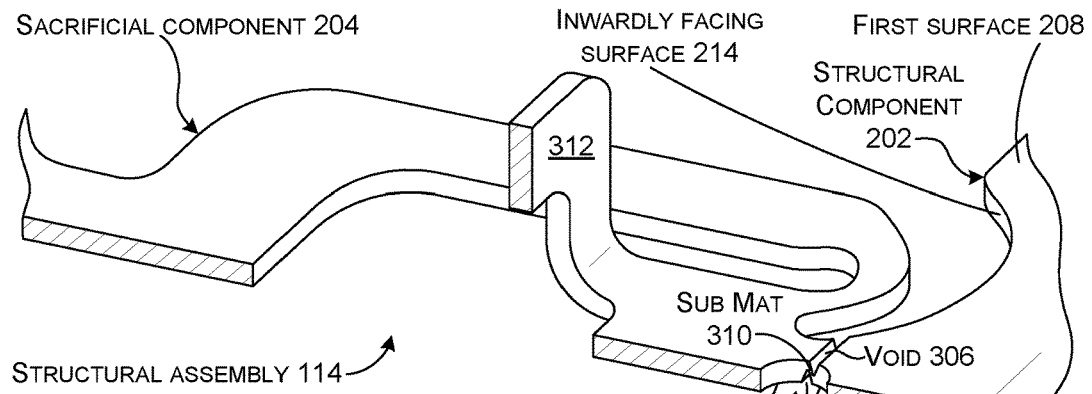
Figure 3C:
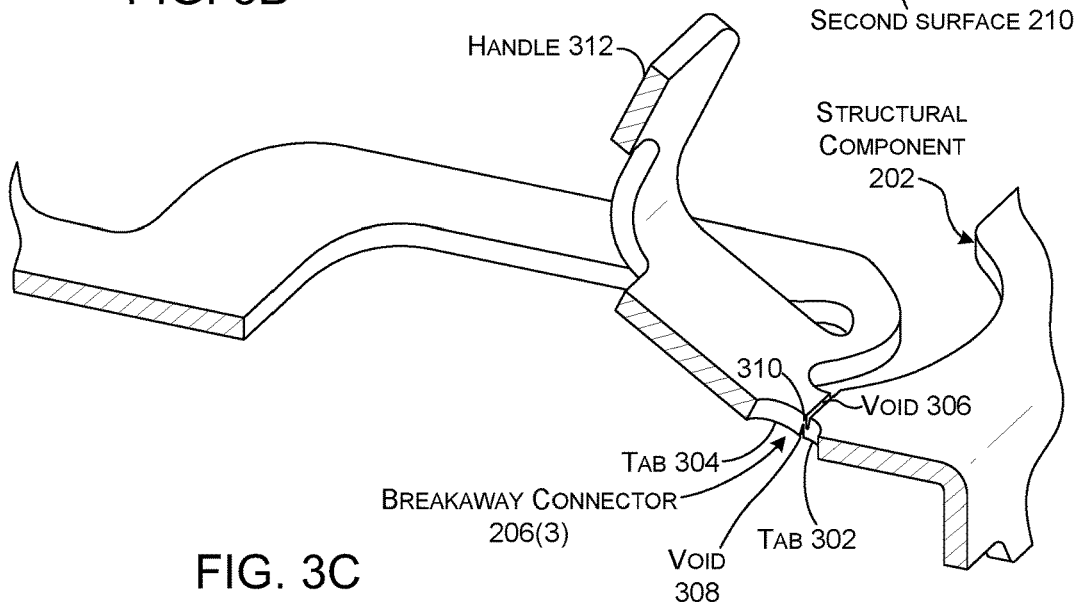
Figure 3D:
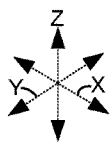
Figure 3D:
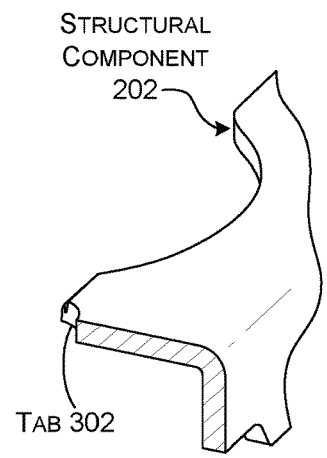

FIGS. 3A-3D collectively show additional details of the breakaway connector 206(3) of the structural assembly 114. FIG. 3A is a perspective view and FIGS. 3B-3D are cutaway perspective views along the plane indicated in FIG. 3A. The breakaway connector 206(3) can include a tab 302 on the structural component 202 and another tab 304 on the sacrificial component 204. The tabs 302 and 304 can be separated by a void 306 formed through the first surface 208 and another void 308 formed through the second surface 210. Void 306 can be offset from void 308 so that the combined depths of the voids is greater than a thickness of the structural assembly 114, yet the voids 306 and 308 do not intersect (e.g., substrate material 310 remains between them). This aspect will be discussed in more detail relative to FIGS. 4A-4C. In this example, the sacrificial component 204 includes a handle 312. As evidenced in FIG. 3C, the handle 312 can be lifted to impart forces upon the breakaway connector 206(3) that breaks the remaining substrate material 310 between the voids 306 and 308. As evidenced in FIG. 3D, the sacrificial component 204 can then be removed so that only the structural component 202 remains.

FIGS. 4A-4C and 5A-5D collectively show a comparison between breakaway connector 206A that is consistent with the present concepts and a conventional breakaway connector 602.

Figure 4A:
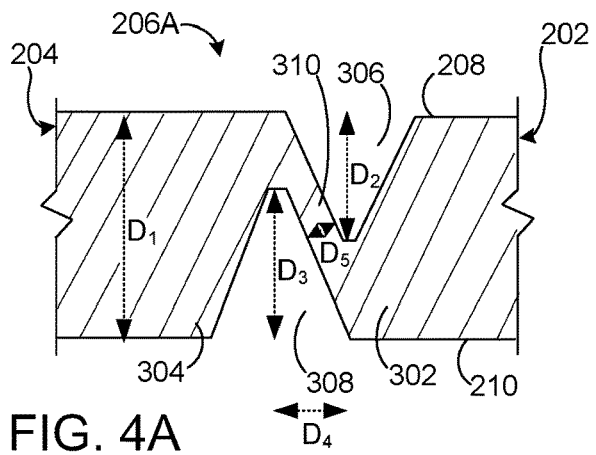

As shown in FIG. 4A, structural component 202 and sacrificial component 204 have a thickness (e.g., dimension $D_1$) between the first surface 208 and the second surface 210. In this example, voids 306 and 308 are both V-shaped. Voids of other implementations can have other shapes. One such example is described below relative to FIGS. 7A-7F. In this case, void 306 has a depth (e.g., dimension $D_2$) and void 308 has a depth (e.g., dimension $D_3$). Void 306 can be partially defined by an upper surface 502 and void 308 can be partially defined by a lower surface 504 (see FIG. 4B). The remaining substrate material 310 can lie between the upper surface 502 and the lower surface 504.

The voids 306 and 308 are offset from one another in the x-reference direction (e.g., the deepest regions of the voids are separated by a distance (e.g., dimension $D_4$). This offset results in substrate material 310 remaining between sides of the voids (as evidenced by dimension $D_5$). This offset allows the voids to overlap (e.g., the sum of the depths of the voids ($D_2+D_3$) is greater than the thickness of the substrate ($D_1$)). The offset further allows the thickness (dimension $D_5$) of the remaining substrate to be much thinner than the conventional configuration of FIGS. 5A-5D while still maintaining the integrity of the structural component 202. For instance, dimension $D_5$ of the remaining substrate 310 can be about ¼ or less of the overall substrate thickness $D_1$.

Figure 5A:
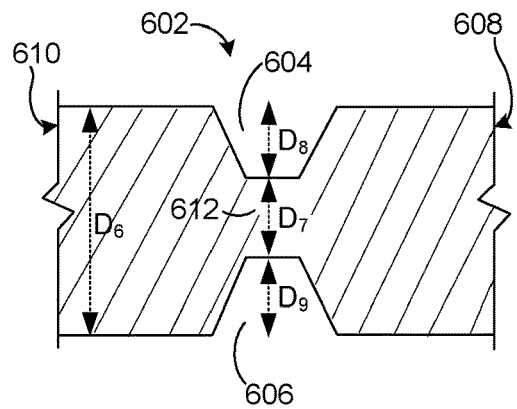
FIGS. 5A-5D are sectional views of conventional devices.

FIG. 5A shows conventional breakaway connector 602. Conventional breakaway connector 602 has a thickness (dimension $D_6$) and aligned voids 604 and 606 between a structural component 608 and a sacrificial component 610. A thickness (dimension $D_7$) of the substrate 612 remaining between the bottoms of the aligned voids 604 and 606 has to be maintained at a minimum of ⅓ of the thickness of the substrate to avoid breakage during assembly. Thus, the depths of each void 604 and 606 is about ⅓ of the depth of the overall substrate and the substrate material 612 remaining between the bottoms of the voids is about ⅓ of the thickness of the overall substrate.

Figure 5B:
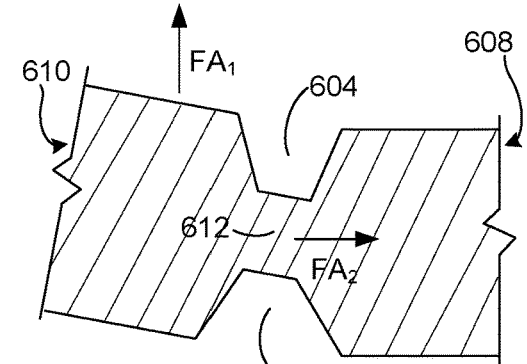
Figure 5C:
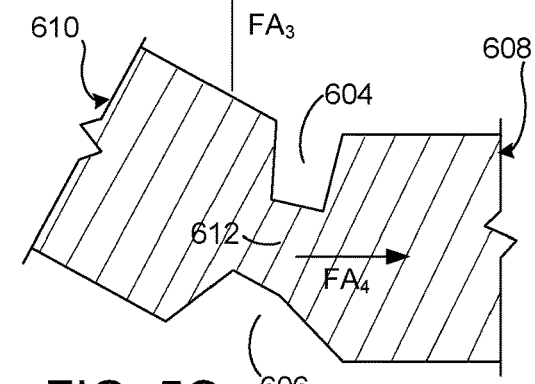

As evidenced in FIGS. 5B and 5C, the thickness of the remaining substrate 612 causes it to be difficult to break when the sacrificial component is lifted. This force transfer is conveyed on FIGS. 5B and 5C by the length of the force arrows (FA). Force arrow one ($FA_1$) represents the upward force applied to the sacrificial component 610 in FIG. 5B and force arrow two ($FA_2$) represents the resulting force transferred to the structural component 608.

The position of the remaining substrate material 612 also causes the remaining substrate material to transfer stress forces to the structural component 608 when the sacrificial component 610 is lifted. FIG. 5C shows that the upward force has been increased (as represented by the length of $FA_3$ relative to the length of $FA_1$ of FIG. 5B). This increased force has not broken the remaining substrate material 612 and is being transferred to the structural component 608 as represented by $FA_4$.

Figure 5D:
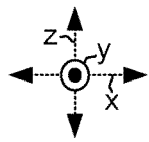
Figure 5D:
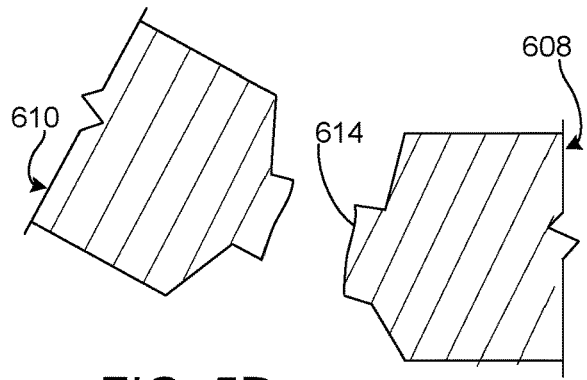

FIG. 5D shows the sacrificial component 610 has been lifted upward until the remaining substrate material 612 has finally broken. The forces required to break the remaining substrate material 612 can damage the structural component 608. Note also, that the break (indicated generally at 614) in the remaining substrate material 612 tends to be generally vertical and extends between the bottom of the two voids through the substrate material. To make this type of break imparts large stress forces on the structural component 608 and increases the likelihood of damage.

Figure 4B:
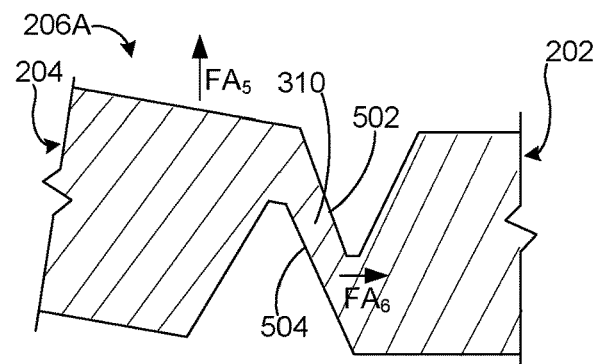

In contrast, FIG. 4B shows that with the configuration of breakaway connector 206A, upward movement of sacrificial component 204 from forces represented by $FA_5$, concentrates forces on remaining substrate material 310.

Figure 4C:
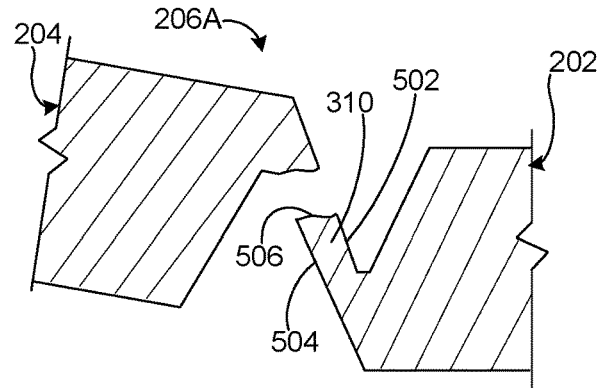

FIG. 4C shows that remaining substrate material 310 readily breaks without transferring large forces to structural component 202 (as represented by relatively short force arrow $FA_6$). Note also that the break tends to create a surface 506 that tends to be horizontal (e.g., extends between the sides of the voids).

FIGS. 6A-6E collectively relate to another example breakaway connector 206B between structural component 202 and sacrificial component 204. This implementation introduces the addition of a strengthening structure 702 in the structural component 202 proximate to the breakaway connector 206B. The strengthening structure can function to limit force transfer from the breakaway connector 206B to a remainder of the structural component 202. This aspect is described in more detail below.

Figure 6A:
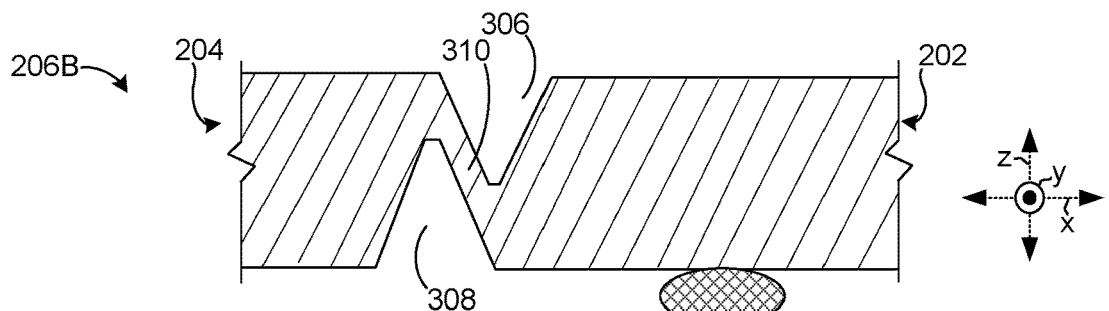
Figure 6B:
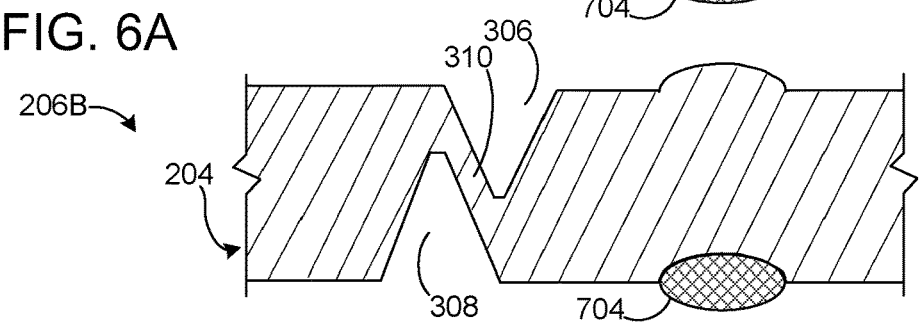
Figure 6C:
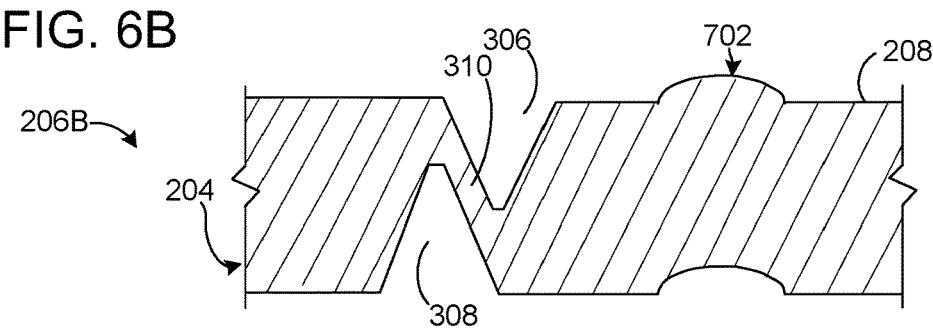

FIGS. 6A-6C show structural component 202 being stamped onto a mandrel 704 to form the strengthening structure 702. Thus, in this example, the strengthening structure 702 is generated by work-hardening (in this case stamping) a region of the structural component 202. In this case, the region extends above a plane defined by the first surface 208 (e.g., extends above a plane that is co-planar with a majority of the structural component). In other implementations, work hardening can be achieved while maintaining the region within or below the plane. In other cases, the strengthening structure 702 can be formed by adding reinforcing material to the region and/or otherwise changing the properties of the region, such as by tempering, among others.

Figure 6D:
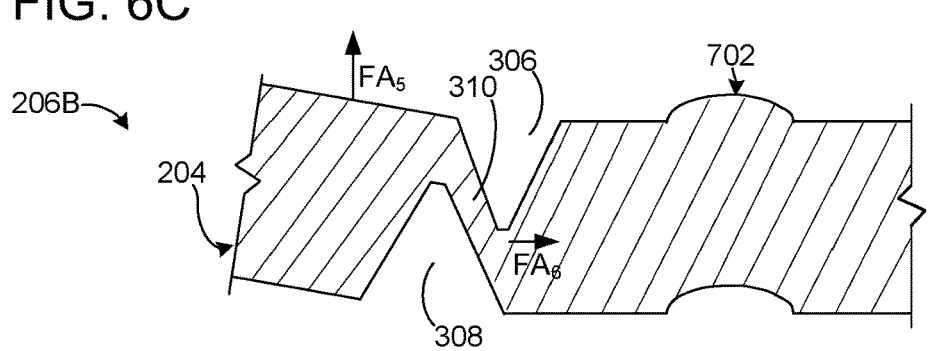
Figure 6E:
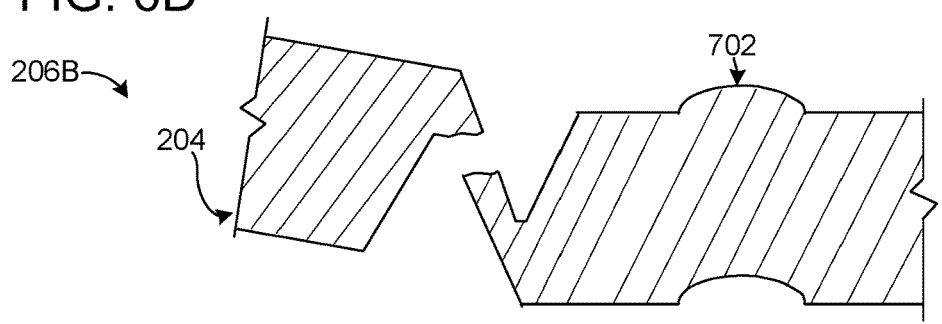

FIGS. 6D and 6E show that upward forces ($FA_5$) applied to the sacrificial component 204 are transferred to the remaining substrate material 310. Any forces ($FA_6$) that are transferred by the remaining substrate material 310 to the structural component 202 tend to be localized by the strengthening structure 702. Thus, deformation of the structural component 202 can be further reduced by the strengthening structure 702. The strengthening structure concepts can be applied to any type of breakaway structure, including traditional designs, to reduce damage during separation.

FIGS. 7A-7F and 8 collectively relate to another example breakaway connector 206C between structural component 202 and sacrificial component 204 of a structural assembly 114C.

FIGS. 7A-7C show mandrel 704 positioned relative to a boundary of the structural assembly 114C to form a strengthening structure 702 at a specified location proximate to the breakaway connector 206C.

FIG. 7D shows examples of various other acts that can be performed on the structural assembly 114C. For instance, the offset and partially overlapping voids 306 and 308 can be formed, such as by cutting and/or ablating material. In this case, the voids 306 and 308 have profiles with generally straight (e.g., vertical) sidewalls and curved bottoms. Further, material can be removed from the interior of the structural assembly 114C as indicated at 802. See for instance, the skeletonized nature of the sacrificial component 204 of FIG. 2A.

FIGS. 7E and 7F show how forces applied to the sacrificial component 204 can easily break the remaining substrate material 310 to separate the sacrificial component 204 from the structural component 202. This can be accomplished without imparting damaging stress forces through the structural component 202.

Figure 8:
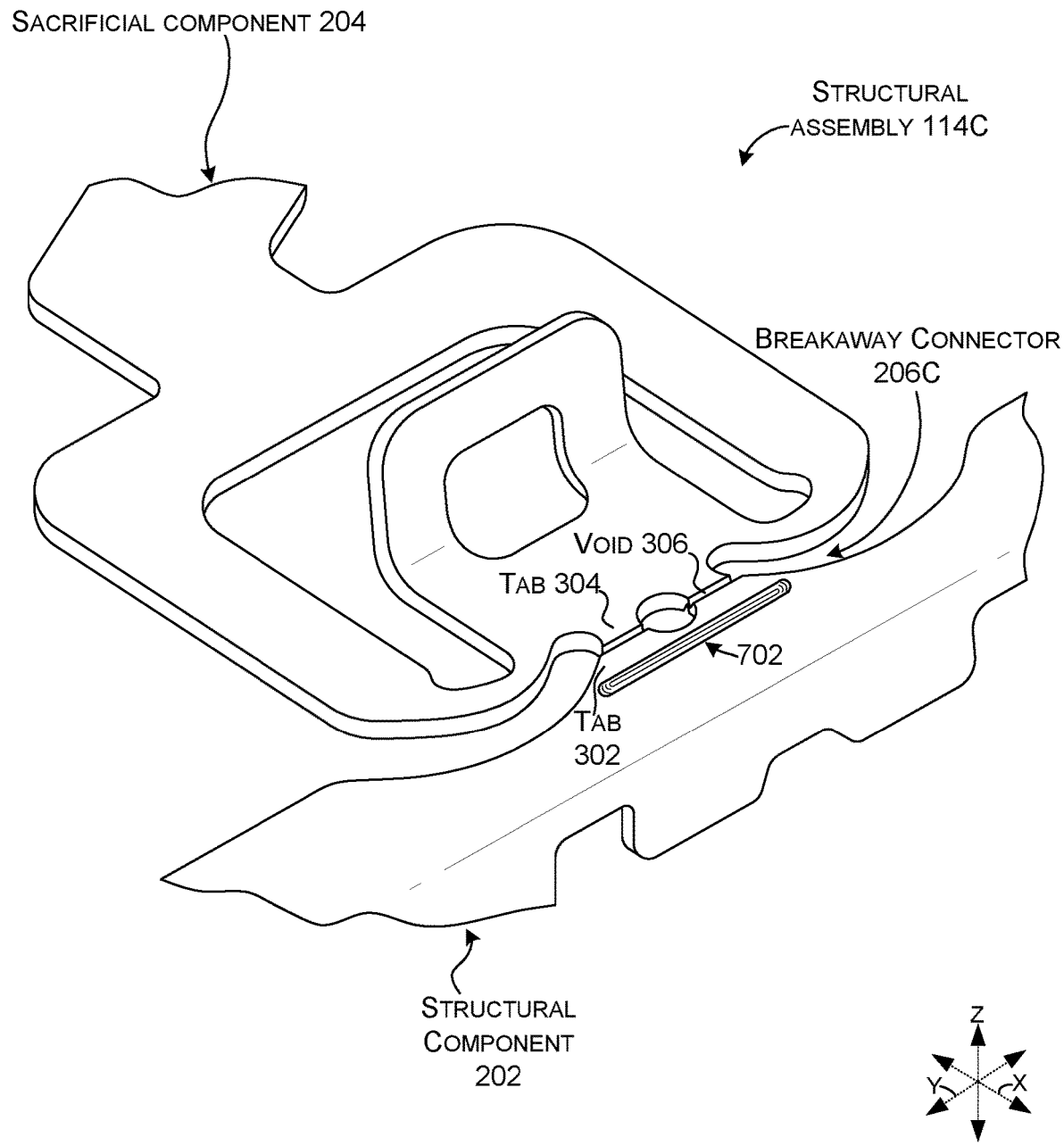

FIG. 8 is a view of structural assembly 114C that is similar to the view of FIG. 3A. In this case, the strengthening structure 702 is positioned on the structural assembly 114C proximate to the breakaway connector 206C. The strengthening structure 702 can extend along the breakaway connector to reduce force transfer throughout the structural component 202.

Figure 9:
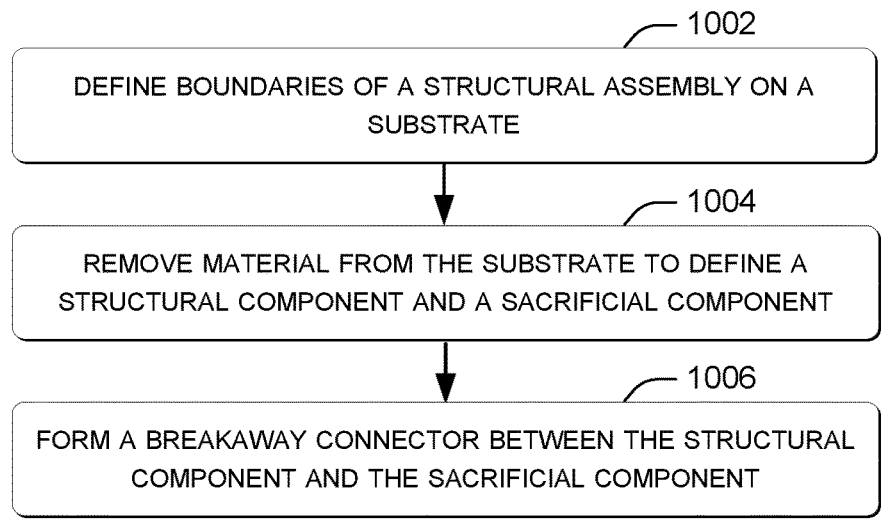
FIGS. 9 and 10 are flowcharts of example structural assembly methods in accordance with the present concepts.

FIG. 9 illustrates a flowchart of a method 1000 relating to some of the current breakaway connector concepts. The method can define boundaries of a structural assembly on a substrate at block 1002. In some cases, the substrate can be manifest as sheets of substrate material, such as sheets of metal. In other cases, the substrate can be manifest as a roll of substrate. Substrate material of the roll can be passed through processing stations to generate the structural assemblies that remain as part of the roll until later stages of the assembly process. For instance, as part of the process, at block 1004, the method can remove material from the substrate to define a structural component and a sacrificial component.

At block 1006, the method can form a breakaway connector between the structural component and the sacrificial component. The breakaway connector can be formed by removing material through a first side of the structural assembly to form a void that extends part way through a thickness of the substrate, and removing additional material through a second side of the structural assembly to form another void that is offset from the void and that extends part way through the thickness of the substrate. Thus, the void and the other void at least partially overlap but do not intersect (at least continuously).

Figure 10:
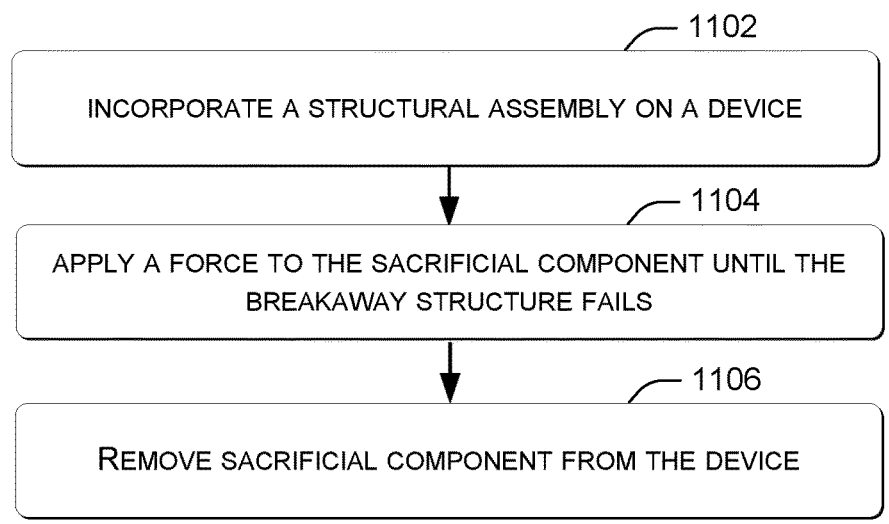

FIG. 10 illustrates a flowchart of a method 1100 relating to some of the current breakaway connector concepts. The method can incorporate a structural assembly on a device at block 1102. The structural assembly can employ overlapping and partially offset opposing voids that form a breakaway connector between a structural component of the structural assembly and a sacrificial component of the structural assembly.

At block 1104, the method can apply a force to the sacrificial component until the breakaway structure fails. At block 1106, the sacrificial component can be removed from the device.

Various breakaway connector concepts are described above. The present concepts can be implemented in other architectures that are consistent with the described functionality. In some cases, the present concepts lend themselves to progressive manufacturing processes. For instance, the concepts can be applied to any part or assembly that can be stamped with a progressive tool to define a structural component and a sacrificial component. For instance, this stamping could occur while the assembly is on a reel of substrate material. Various processing can be preformed on the assembly while on the reel and/or after removal from the reel. Such processing can include plating, painting, and/or gluing, among others. In such cases, the sacrificial component can provide rigidity and/or a place to hold so that all portions of the structural component can be processed. Employing the present concepts can allow the sacrificial component to ultimately be removed without damage to the remaining structural component.

The present breakaway connector concepts can be utilized with various types of devices, such as computing devices that can include but are not limited to notebook computers, tablet computers, smart phones, wearable smart devices, headphones, antennas, gaming devices, entertainment consoles, rigid devices, flexible devices, home and enterprise appliances, automobiles, machinery, and/or other developing or yet to be developed types of devices. As used herein, a computing device can be any type of device that has some amount of processing and/or storage capacity.

Various examples are described above. Additional examples are described below. One example includes a device comprising an electronic component positioned on a base, a structural component surrounding the electronic component to provide at least a portion of a 'shield can' around the electronic component, the structural component defining opposing first and second surfaces and an inwardly facing tab, and the inwardly facing tab defines: an upper surface extending downwardly from the first surface, an offset lower surface extending upwardly from the second surface past at least a portion of the upper surface, and a surface connecting the upper surface and the offset lower surface.

Another example can include any of the above and/or below examples where the electronic component comprises a processor and the base comprises a circuit board.

Another example can include any of the above and/or below examples where the structural component comprises a sidewall of the shield can.

Another example can include any of the above and/or below examples where the structural component further comprises a strengthening structure that separates the tab from a remainder of the structural component.

Another example can include any of the above and/or below examples where the strengthening structure extends above a plane that is coplanar with a majority of the structural component.

Another example can include any of the above and/or below examples where the upper surface is curved.

Another example can include any of the above and/or below examples where the upper surface is straight.

Another example can include any of the above and/or below examples where the upper surface is orthogonal to the first surface.

Another example includes a structural assembly comprising a structural component defining a periphery of the structural assembly and an internal region of the structural assembly and a sacrificial component positioned in the internal region and secured to the structural component by a breakaway connector that defines a first void and an opposing second void that is at least partially offset from the first void.

Another example can include any of the above and/or below examples where combined depths of the first and second voids is greater than a thickness of the sacrificial component.

Another example includes a method comprising defining boundaries of a structural assembly on a substrate, removing material from the substrate to define a structural component and a sacrificial component, and forming a breakaway connector between the structural component and the sacrificial component by removing material through a first side of the structural assembly to form a void that extends part way through a thickness of the substrate, and removing additional material through a second side of the structural assembly to form another void that is offset from the void and that extends part way through the thickness of the substrate, such that the void and the another void at least partially overlap but do not intersect.

Another example can include any of the above and/or below examples where the substrate comprises a roll of substrate.

Another example can include any of the above and/or below examples where the substrate comprises a sheet of metal.

Another example can include any of the above and/or below examples where forming a breakaway connector comprises forming multiple breakaway connectors.

Another example can include any of the above and/or below examples where the sacrificial component and the structural component are connected only at the breakaway connectors.

Another example can include any of the above and/or below examples where a shape of the void is the same as a shape of the (an)other void.

Another example can include any of the above and/or below examples where a shape of the void is different than a shape of the (an)other void.

Another example can include any of the above and/or below examples where the method further comprises forming a strengthening structure on the structural component proximate to the breakaway connector.

Another example can include any of the above and/or below examples where the forming a strengthening structure comprises work-hardening a region of the structural component.

CONCLUSION

Although techniques, methods, devices, systems, etc., pertaining to breakaway connectors are described in language specific to structural features and/or methodological acts, it is to be understood that the subject matter defined in the appended claims is not limited to the specific features or acts described. Rather, the specific features and acts are disclosed as example forms of implementing the claimed methods, devices, systems, etc.

The invention claimed is:

1. A device, comprising:
an electronic component positioned on a base; and,
a structural component surrounding the electronic component to provide at least a portion of a shield can around the electronic component;
the structural component having a first thickness defined between opposing first and second surfaces and an inwardly facing tab, and,
the inwardly facing tab defines: an upper surface extending downwardly from the first surface, an offset lower surface extending upwardly from the second surface past at least a portion of the upper surface, and a surface connecting the upper surface and the offset lower surface and having a second thickness that is less than the first thickness.

2. The device of claim 1, wherein the electronic component comprises a processor and the base comprises a circuit board.

3. The device of claim 2, wherein the structural component comprises a sidewall of the shield can.

4. The device of claim 1, wherein the structural component further comprises a strengthening structure that separates the tab from a remainder of the structural component.

5. The device of claim 4, wherein the strengthening structure comprises a work-hardened region.

6. The device of claim 4, wherein the strengthening structure extends above a plane that is coplanar with a majority of the structural component.

7. The device of claim 1, wherein the upper surface is curved.

8. The device of claim 1, wherein the upper surface is straight.

9. The device of claim 8, wherein the upper surface is orthogonal to the first surface.

10. The device of claim 1, wherein the second thickness is measured at a narrowest point between the upper surface and the lower surface.

11. The device of claim 10, wherein the second thickness is less than ¼ of the first thickness.

12. A structural assembly, comprising:
a structural component defining a periphery of the structural assembly and an internal region of the structural assembly; and,
a sacrificial component positioned in the internal region and secured to the structural component by a breakaway connector that defines a first void and an opposing second void that is at least partially offset from the first void, and a thickness of material between the first void and the second void is less than a thickness of the sacrificial component.

13. The structural assembly of claim 12, wherein the thickness of the material between the first void and the second void is measured at a narrowest point between the first void and the second void.

14. The structural assembly of claim 13, wherein the thickness of the material between the first void and the second void is less than ¼ of the thickness of the sacrificial component.

15. The structural assembly of claim 12, wherein combined depths of the first and second voids is greater than the thickness of the sacrificial component.

16. A device, comprising:
an electronic component positioned over a base; and,
a structural component positioned over the base and around the electronic component;
the structural component having a first thickness defined between opposing first and second surfaces and an inwardly facing tab, and,
the inwardly facing tab defines: an upper surface extending downwardly from the first surface, an offset lower surface extending upwardly from the second surface past at least a portion of the upper surface, and a surface connecting the upper surface and the offset lower surface and having a second thickness that is less than the first thickness.

17. The device of claim 16, wherein the second thickness is measured at a narrowest point between the upper surface and the lower surface.

18. The device of claim 17, wherein the second thickness is less than ¼ of the first thickness.

19. The device of claim 16, wherein the surface is generally parallel to the first surface.

* * * * *